United States Patent [19]
Lo et al.

[11] Patent Number: 6,042,777
[45] Date of Patent: Mar. 28, 2000

[54] MANUFACTURING OF HIGH DENSITY INTERMETALLIC SPUTTER TARGETS

[75] Inventors: Chi-Fung Lo, Fort Lee, N.J.; Darryl Draper, Congers, N.Y.; Hung-Lee Hoo, Livingston, N.J.; Paul S. Gilman, Suffern, N.Y.

[73] Assignees: Sony Corporation, Tokyo, Japan; Materials Research Corporation, Orangeburg, N.Y.

[21] Appl. No.: 09/366,453

[22] Filed: Aug. 3, 1999

[51] Int. Cl.[7] ................................. B22F 3/12; B22F 7/04
[52] U.S. Cl. ..................................... 419/8; 419/48; 419/54
[58] Field of Search ..................................... 419/8, 48, 54

[56] References Cited

U.S. PATENT DOCUMENTS 4,752,335  6/1988  Korb ......................................... 75/249
5,342,571  8/1994  Dittmar et al. ........................... 419/13

*Primary Examiner*—Daniel J. Jenkins
*Attorney, Agent, or Firm*—Wood, Herron & Evans, L.L.P.

[57] ABSTRACT

There is provided a method for fabricating intermetallic sputter targets of two or more elements in which a mixture of two or more elemental powders are blended and synthesized within a pressing apparatus at a temperature below the melting point of the lowest melting point element in the mixture, followed by heating the synthesized intermetallic powder in the pressing apparatus to a temperature below the melting point of the intermetallic structure while simultaneously applying pressure to the powder to achieve a final density greater than 90% of theoretical density. The powder metallurgy technique of the present invention provides a better microstructure than cast structures, and avoids contamination of the sputter target by eliminating the crushing step of synthesized intermetallic chunks necessitated by separate steps of synthesizing and pressing.

37 Claims, No Drawings

MANUFACTURING OF HIGH DENSITY INTERMETALLIC SPUTTER TARGETS

FIELD OF THE INVENTION

This invention relates to a method of fabricating intermetallic sputter targets, from a mixture of two or more elemental powders, for use in the physical vapor deposition of intermetallic films in the manufacture of semiconductor devices.

BACKGROUND OF THE INVENTION

Intermetallic films of two or more elements are used as resistors or diffusion barriers in semiconductor devices. The intermetallic films are normally deposited onto the semiconductor wafers via the physical vapor deposition (PVD) process. In the PVD process, a sputter target material is bombarded by a plasma or ion beam, which dislodges particles of sputter target material from the sputter surface. These dislodged particles are then deposited onto the semiconductor wafer as a thin film.

Intermetallic sputter targets of two or more elements can be produced either by powder metallurgy or casting techniques. The powder metallurgy method provides a more uniform microstructure than the casting method with respect to grain size distribution, which is an important parameter for controlling thin film properties. Furthermore, due to large differences in the melting points of individual elements comprising many intermetallic target materials, the casting method is less favorable.

The powder metallurgy technique may provide either multiple-phase metallic target structures or single-phase intermetallic target structures, depending on the forming process and the properties of the individual elements. A disadvantage of multiple-phase metallic structures is that due to the difference in sputtering rate between individual elements, the uniformity of the film composition may be inferior to that obtained from single-phase intermetallic compounds. For example, in a multiple-phase Ti—Al sputter target, aluminum will sputter faster than titanium. For a single-phase $TiAl_3$ compound, the intermetallic compound sputters at a consistent rate, and therefore may contribute to a more uniform composition for the deposited film.

The prior powder metallurgy technique used to obtain intermetallic sputter targets involved synthesizing the metallic powders in a heating furnace without pressure, whereby the individual metals react to form chunks of intermetallic material. A milling or crushing process is then required to fine the sintered chunks to a powder consistency. The powder may then be pressed to form a high-density intermetallic sputter target. This prior method employs two separate steps with intermediate milling to achieve the pressed sputter target. The milling process tends to contribute to contamination of the sputter target material, which may cause non-uniformity of the deposited thin film.

There is thus a need to develop a method for producing high-density intermetallic sputter targets that minimizes contamination from the processing method.

SUMMARY OF THE INVENTION

The present invention provides a method of making intermetallic sputter targets of two or more elements by synthesizing a mixture of two or more elemental powders, directly followed by sintering and pressing the synthesized intermetallic structure to produce a high-density pressed target. To this end, and in accordance with the principles of the present invention, a blend of metallic powders are synthesized in a containment vessel, such as a pressing mold or metal can, by heating the powder blend to a temperature of about 100° C. to about 400° C. below the lowest melting point of the metallic powders, without external pressure. The powder mixture is held at this temperature for at least about one hour, or until the metallic powder has been completely transformed to an intermetallic structure. The synthesized intermetallic powder is then heated within the containment vessel to a second temperature of about 50° C. to about 300° C. below the melting point of the intermetallic compound while simultaneously applying an external pressure to the compound to form a high-density intermetallic sputter target. The intermetallic powder is preferably held at the second temperature and pressure for at least 1 hour. The pressure may be applied uniaxially to the intermetallic powder by a pressing die mold at a pressure of at least about 0.5 ksi, or may be applied isostatically to the intermetallic powder contained within a sealed and evacuated capsule at a pressure of at least about 10 ksi.

In an alternative embodiment of the present invention, hydrogen purging during synthesis of the intermetallic structure reduces the oxygen level in the final sputter target. After the intermetallic structure is formed, it is then preferable to press the powder under a vacuum to remove any residual hydrogen. In yet another alternative embodiment of the present invention, for larger particle sizes, in particular larger than 100 μm, a multiple-step heating process may be used in which the powder is heated from the synthesizing temperature in increments of about 200–300° C., and held at each increment for about 1–3 hours, until the final sintering temperature is reached.

Through the embodiments of the present invention, a low-contamination method is provided for making intermetallic sputter targets having a final density of at least 90% of theoretical density and a single-phase intermetallic structure.

DETAILED DESCRIPTION

The present invention provides a method for fabricating intermetallic sputter targets of two or more elements using a mixture of two or more elemental powders, particularly where the difference in melting temperatures between the individual metals is significant. The method of the present invention utilizes a two-stage thermal process within a single apparatus such that no intermediate crushing of intermetallic chunks is necessary. The resulting intermetallic sputter target has a final density greater than about 90% of theoretical density and minimal contamination resulting from the powder metallurgy technique.

In the first stage of the thermal process of the present invention, two or more metallic powders are uniformly blended and loaded into a containment vessel or pressing apparatus. The metallic powders, by way of example, may be two or more of Ti, Al, Ni, Cr, Cu, Co, Fe, W, Si, Mo and Ta. By way of further example, intermetallic structures may be formed from the following powder blends: Ti—Al, Ni—Al, Cr—Al, Cu—Al, Co—Al, Fe—Al, W—Si, Mo—Si, Ta—Si, Ti—Si, Co—Si, Cr—Si, Al—Si—Ti and Al—Ni—Ti. Although this exemplary listing includes bimetallic and tri-metallic blends only, it is to be understood that the principles of the present invention also apply to intermetallic blends of four or more elements. The amount of each metallic powder used is dependant on the desired final intermetallic structure. For example, 1 mole of titanium for every 3 moles of aluminum may be used for achieving a final intermetallic $TiAl_3$ structure.

The containment vessel used for loading the blended powder is dependent upon the pressing technique to be used to apply the pressure to the powder bed. The hot-pressing technique may be used in which the containment vessel is a die mold, such as a graphite die mold. Alternatively, the hot-isostatic-pressing technique may be used in which the containment vessel is an evacuated and sealed metal can, such as titanium, stainless steel, beryllium, cobalt, copper, iron, molybdenum or nickel.

Once loaded in the containment vessel, the powder blend is heated in a vacuum or inert gas atmosphere, such as argon or nitrogen, to a temperature of about 100° C. to about 400° C. below the lowest melting point of each of the metal components of the powder blend. For example, for a powder blend of Ti—Al, the melting point of Ti is about 1670° C. and the melting temperature of Al is about 660° C., so the powder blend is heated to a temperature of about 100–400° C. below the melting point of aluminum. In other words, the Ti—Al blend is heated to a temperature of about 260° C. to about 560° C. The powder blend is held at this temperature for at least about 1 hour, or until such a time as the metallic powder has been completely transformed to an intermetallic structure. For powders having an average particle size below 100 $\mu$m, the synthesis typically takes about 1–5 hours. For powder sizes less than 40 $\mu$m, the synthesis only takes about 1–2 hours. If the particle size is greater than 100 $\mu$m, full synthesis occurs in about 5–8 hours. At the synthesis stage, no external pressure is applied, which avoids cracking the containment vessel, such as the graphite die, by explosive stresses induced by the exothermic reaction between the metallic powders. Furthermore, the presence of the containment vessel during synthesis confines the powder components and prevents them from forming chunks that require crushing prior to pressing. Rather, a more compact powder bed is formed that may be pressed directly after synthesis within the containment vessel.

After completion of the synthesis, while still in the containment vessel, the second stage immediately commences in which the intermetallic powder is heated in the vacuum or inert gas atmosphere to a temperature of about 50° C. to about 300° C. below the melting point of the intermetallic compound. The melting point of the intermetallic compound is normally in the range between the melting point of the individual elemental powders, and may be determined by referring to the phase diagram for the particular alloy system. Again using the Ti—Al system as an example, TiAl$_3$ has a melting point of about 1350° C. Thus, for this particular single-phase intermetallic compound, the second stage temperature would be about 50° C. to about 300° C. below the intermetallic melting temperature of 1350° C. In other words, the intermetallic powder is heated to about 1050° C. to about 1300° C. For tri-metallic blends, a ternary intermetallic compound may be formed, or two or three binary intermetallic compounds may form to comprise the final intermetallic structure. This equally holds true for blends of four or more elemental powders. For such systems, each intermetallic compound has a melting point. Thus, the second stage temperature for heating the intermetallic powder would be about 50° C. to about 300° C. below the lowest melting temperature of the intermetallic compounds present in the intermetallic structure.

Simultaneously with the second stage heating, pressure is applied to the intermetallic compound. For example, a uniaxial pressure is applied to the pressing die mold or an isostatic pressure is applied to the capsulized powder within the metal can. Uniaxial pressing typically occurs at a pressure of at least 0.5 ksi, and isostatic pressing typically occurs at a pressure of at least 10 ksi. The temperature and pressure are held for at least 1 hour to fully densify the intermetallic powder.

Once the powder is fully densified, the pressure is released and the target blank is cooled. The pressed target blank may then be machined to the desired final shape and dimensions using a mechanical lathe, cutter or grinder.

In an alternative embodiment of the present invention, for powders having an average particle size greater than 100 $\mu$m, a multiple-step heating process may be used for the first stage to lessen the synthesis time for forming the intermetallic structure. In this embodiment, the blended powder is partially synthesized by heating to the temperature of about 100° C. to about 400° C. below the lowest melting point of each of the metal components of the powder blend and holding this first temperature for about 1–3 hours, followed by heating to the second stage temperature in increments of 200–300° C. Each temperature increment is held for about 1–3 hours prior to the next increment. Thus, while the intermetallic structure may not be fully formed after holding at the first temperature, it does fully form during the incremental heating prior to the final sintering temperature and pressure. So for larger particle size powders, this multiple-step first stage heating process may be recommended to shorten the synthesis time.

In yet another alternative embodiment of the present invention, sputter targets may be produced for low oxygen applications. Hydrogen purging during the intermetallic structure formation will result in a reduced oxygen level. Thus, during the synthesis stage, the containment vessel is purged with hydrogen to prevent the presence of oxygen that would react with the powder components to form oxides. This hydrogen purge will result in the presence of some residual hydrogen in the vessel following the formation of the intermetallic structure. Thus, a vacuum is then formed in the containment vessel for the second stage, and the intermetallic powder is heated with pressure whereby residual hydrogen is removed while forming the high-density intermetallic sputter target.

To further demonstrate the principles of the present invention, the following exemplary examples are provided.

EXAMPLE 1

Six moles of aluminum powder (162 gm) having a melting temperature of about 660° C. and two moles of titanium (96 gm) having a melting temperature of about 1670° C. were blended for 3 hours to obtain a uniform blend. The blended powder was then loaded into a graphite die mold, heated in the mold to 350° C. (this first temperature being 310° C. below the melting point of the lowest melting point metal in the blend) in an argon atmosphere and held at 350° C. for about 2 hours. The temperature was then raised within the graphite die mold to a temperature of 1200° C. (this temperature being 150° C. below the melting point of intermetallic TiAl$_3$) while the pressure was increased to 1 ksi. The temperature of 1200° C. and pressure of 1 ksi were held for 3 hours. The pressure was then released and the pressed sputter target was allowed to cool to room temperature. The density of the pressed sputter target was about 96% of theoretical density, and the target structure was identified as single phase TiAl$_3$ by X-ray diffraction. The pressed blank was then ground to 0.25 inch thick using a diamond wheel grinder and machined to 3 inch diameter using a mechanical lathe with a WC point tool. The machined sputter target disk was then bonded to a copper backing plate to form a complete sputter target/backing plate assembly and mounted in a sputtering machine where a TiAl$_3$ thin film was deposited on a semiconductor wafer by physical vapor deposition.

EXAMPLE 2

To produce a tri-metallic sputter target of Al, Si and Ti, the three metallic powders having melting temperatures of 660° C., 1414° C. and 1668° C., respectively, are blended until uniform, loaded into a containment vessel, and heated to a first temperature of about 260–560° C. The blend is held at this first temperature for 1–8 hours until the intermetallic structure of Al$_2$Si$_2$Ti forms. The temperature is then raised to a second temperature of about 927° C. to about 1177° C., which is 300° C.–50° C. below the intermetallic melting point of 1227° C. as determined from the ternary phase diagram. While at this second temperature, uniaxial or isostatic pressure is applied and held for at least 1 hour to fully densify the powder.

EXAMPLE 3

To produce a tri-metallic sputter target of Al, Ni and Ti, the three metallic powders having melting temperatures of 660° C., 1455° C. and 1668° C., respectively, are blended until uniform, loaded into a containment vessel, and heated to a first temperature of about 260° C.–560° C. The blend is held at this first temperature for 1–8 hours until the intermetallic structure forms. For this system, the intermetallic structure will comprise the binary compounds AlNi$_3$, AlTi and NiTi, having intermetallic melting points of 1385° C., 1350° C. and 1310° C., respectively. The temperature is then raised to a second temperature of about 1010° C. to about 1260° C., which is 300° C.–500° C. below the lowest intermetallic melting point of 1310° C. as determined from the three binary phase diagrams. While at this second temperature, uniaxial or isostatic pressure is applied and held for at least 1 hour to fully densify the powder.

There is thus provided a method for producing high-density intermetallic sputter targets that minimizes contamination from the processing method.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, while a number of representative alloy systems were provided, the present invention provides a method for forming any intermetallic sputter target. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of forming an intermetallic sputter target, comprising the steps of:

mixing a first metallic powder having a melting point with at least a second metallic powder having a melting point to form a blend of at least two metallic powders, the melting point of the first metallic powder being lower than the melting point of the at least second metallic powder;

heating the blend in a containment vessel to a first temperature of from about 400° C. below the melting point of the first metallic powder to about 100° C. below the melting point of the first metallic powder for a period of time effective to form an intermetallic structure having at least one melting point;

heating the intermetallic structure in the containment vessel to a second temperature of between about 300° C. below the at least one melting point of the intermetallic structure to about 50° C. below the at least one melting point of the intermetallic structure; and simultaneously applying pressure to the intermetallic structure to thereby form a high density intermetallic sputter target.

2. The method of claim 1, wherein the first and second metallic powders are elements selected from the group consisting of: Ti, Al, Ni, Cr, Cu, Co, Fe, W, Si, Mo and Ta.

3. The method of claim 1, wherein the blend of metallic powders is a bi-metallic blend selected from the group consisting of: Ti—Al, Ni—Al, Cr—Al, Cu—Al, Co—Al, Fe—Al, W—Si, Mo—Si, Ta—Si, Ti—Si, Co—Si and Cr—Si.

4. The method of claim 1, wherein the metallic powders have an average particle size less than about 100 μm.

5. The method of claim 1, wherein the blend is held at the first temperature for a period of at least about 1 hour.

6. The method of claim 1, wherein the intermetallic structure is held at the second temperature and the pressure for at least about 1 hour.

7. The method of claim 1, wherein the containment vessel is a pressing die mold and the pressure is applied uniaxially.

8. The method of claim 7, wherein the pressure applied is at least about 0.5 ksi.

9. The method of claim 1, wherein the containment vessel is a sealed and evacuated capsule and the pressure is applied isostatically.

10. The method of claim 9, wherein the pressure applied is at least about 10 ksi.

11. The method of claim 1, wherein the step of heating the blend of metallic powders to the first temperature is performed in a hydrogen atmosphere, and wherein the step of applying pressure is performed under a vacuum to control oxygen content in the sputter target.

12. The method of claim 1, wherein the blend of metallic powders have an average particle size greater than about 100 μm.

13. The method of claim 12, wherein the blend of metallic powders is heated to the first temperature for about 1–3 hours to partially form the intermetallic structure followed by heating to the second temperature by a multiple-step heating process comprising raising the temperature from the first temperature to the second temperature in increments of about 200–300° C., and holding at each increment of temperature for about 1–3 hours to fully form the intermetallic structure.

14. The method of claim 1, wherein the mixing step includes mixing a third metallic powder with the first and second metallic powders to form a tri-metallic blend, the third metallic powder having a melting point greater than the melting point of the first metallic powder.

15. The method of claim 14, wherein the tri-metallic blend is Al—Si—Ti or Al—Ni—Ti.

16. A method of forming an intermetallic sputter target, comprising the steps of:

mixing a first metallic powder having a melting point with at least a second metallic powder having a melting point to form a blend of at least two metallic powders, the melting point of the first metallic powder being lower than the melting point of the at least second metallic powder;

heating the blend in a pressing die mold to a first temperature of from about 400° C. below the melting point of the first metallic powder to about 100° C. below the melting point of the first metallic powder for a period of time effective to form an intermetallic structure having at least one melting point;

heating the intermetallic structure in the pressing die mold to a second temperature of between about 300° C. below the at least one melting point of the intermetallic structure to about 50° C. below the at least one melting point of the intermetallic structure; and simultaneously applying a uniaxial pressure of at least about 0.5 ksi to the intermetallic structure to thereby form a high density intermetallic sputter target.

17. The method of claim 14, wherein the first and second metallic powders are elements selected from the group consisting of: Ti, Al, Ni, Cr, Cu, Co, Fe, W, Si, Mo and Ta.

18. The method of claim 14, wherein the blend of metallic powders is a bi-metallic blend selected from the group consisting of: Ti—Al, Ni—Al, Cr—Al, Cu—Al, Co—Al, Fe—Al, W—Si, Mo—Si, Ta—Si, Ti—Si, Co—Si and Cr—Si.

19. The method of claim 14, wherein the metallic powders have an average particle size less than about 100 μm.

20. The method of claim 14, wherein the blend is held at the first temperature for a period of at least about 1 hour.

21. The method of claim 14, wherein the intermetallic structure is held at the second temperature and the pressure for at least about 1 hour.

22. The method of claim 14, wherein the step of heating the blend of metallic powders to the first temperature is performed in a hydrogen atmosphere, and wherein the step of applying pressure is performed under a vacuum to control oxygen content in the sputter target.

23. The method of claim 14, wherein the blend of metallic powders have an average particle size greater than about 100 μm.

24. The method of claim 21, wherein the blend of metallic powders is heated to the first temperature for about 1–3 hours to partially form the intermetallic structure followed by heating to the second temperature by a multiple-step heating process comprising raising the temperature from the first temperature to the second temperature in increments of about 200–300° C., and holding at each increment of temperature for about 1–3 hours to fully form the intermetallic structure.

25. The method of claim 16, wherein the mixing step includes mixing a third metallic powder with the first and second metallic powders to form a tri-metallic blend, the third metallic powder having a melting point greater than the melting point of the first metallic powder.

26. The method of claim 25, wherein the tri-metallic blend is Al—Si—Ti or Al—Ni—Ti.

27. A method of forming an intermetallic sputter target, comprising the steps of:

mixing a first metallic powder having a melting point with at least a second metallic powder having a melting point to form a blend of at least two metallic powders, the melting point of the first metallic powder being lower than the melting point of the at least second metallic powder;

heating the blend in an evacuated and sealed metal capsule to a first temperature of from about 400° C. below the melting point of the first metallic powder to about 100° C. below the melting point of the first metallic powder for a period of time effective to form an intermetallic structure having the at least one melting point;

heating the intermetallic structure in the metal capsule to a second temperature of between about 300° C. below the at least one melting point of the intermetallic structure to about 50° C. below the at least one melting point of the intermetallic structure; and simultaneously applying an isostatic pressure of at least about 10 ksi to the intermetallic structure to thereby form a high density intermetallic sputter target.

28. The method of claim 23, wherein the first and second metallic powders are elements selected from the group consisting of: Ti, Al, Ni, Cr, Cu, Co, Fe, W, Si, Mo and Ta.

29. The method of claim 23, wherein the blend of metallic powders is a bimetallic blend selected from the group consisting of: Ti—Al, Ni—Al, Cr—Al, Cu—Al, Co—Al, Fe—Al, W—Si, Mo—Si, Ta—Si, Ti—Si, Co—Si and Cr—Si.

30. The method of claim 23, wherein the metallic powders have an average particle size less than about 100 μm.

31. The method of claim 23, wherein the blend is held at the first temperature for a period of at least about 1 hour.

32. The method of claim 23, wherein the intermetallic structure is held at the second temperature and the pressure for at least about 1 hour.

33. The method of claim 23, wherein the step of heating the blend of metallic powders to the first temperature is performed in a hydrogen atmosphere, and wherein the step of applying pressure is performed under a vacuum to control oxygen content in the sputter target.

34. The method of claim 23, wherein the blend of metallic powders have an average particle size greater than about 100 μm.

35. The method of claim 23, wherein the blend of metallic powders is heated to the first temperature for about 1–3 hours to partially form the intermetallic structure followed by heating to the second temperature by a multiple-step heating process comprising raising the temperature from the first temperature to the second temperature in increments of about 200–300° C., and holding at each increment of temperature for about 1–3 hours to fully form the intermetallic structure.

36. The method of claim 27, wherein the mixing step includes mixing a third metallic powder with the first and second metallic powders to form a tri-metallic blend, the third metallic powder having a melting point greater than the melting point of the first metallic powder.

37. The method of claim 36, wherein the tri-metallic blend is Al—Si—Ti or Al—Ni—Ti.

* * * * *